(12) United States Patent
Yoon et al.

(10) Patent No.: US 11,286,556 B2
(45) Date of Patent: Mar. 29, 2022

(54) SELECTIVE DEPOSITION OF TITANIUM FILMS

(71) Applicant: Applied Materials, Inc., Santa Clara, CA (US)

(72) Inventors: Byunghoon Yoon, Cupertino, CA (US); Wei Lei, Campbell, CA (US); Sang Ho Yu, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 113 days.

(21) Appl. No.: 16/848,113

(22) Filed: Apr. 14, 2020

(65) Prior Publication Data

US 2021/0317570 A1 Oct. 14, 2021

(51) Int. Cl.
| | |
|---|---|
| *C23C 16/18* | (2006.01) |
| *C23C 16/505* | (2006.01) |
| *C23C 16/455* | (2006.01) |
| *C23C 16/04* | (2006.01) |
| *H01L 21/768* | (2006.01) |
| *C23C 16/34* | (2006.01) |
| *H01L 21/285* | (2006.01) |
| *H01L 21/3205* | (2006.01) |

(52) U.S. Cl.
CPC ............. *C23C 16/18* (2013.01); *C23C 16/04* (2013.01); *C23C 16/34* (2013.01); *C23C 16/45553* (2013.01); *C23C 16/505* (2013.01); *H01L 21/28562* (2013.01); *H01L 21/28568* (2013.01); *H01L 21/76877* (2013.01); *H01L 21/32051* (2013.01)

(58) Field of Classification Search
None
See application file for complete search history.

(56) References Cited

U.S. PATENT DOCUMENTS

| | | | |
|---|---|---|---|
| 5,278,100 A * | 1/1994 | Doan | H01L 21/285 148/DIG. 147 |
| 2003/0017268 A1 | 1/2003 | Hu et al. | |
| 2003/0072884 A1 | 4/2003 | Zhang et al. | |
| 2004/0013803 A1 | 1/2004 | Chung et al. | |
| 2009/0074983 A1* | 3/2009 | Heys | C23C 16/45553 427/569 |
| 2013/0337659 A1* | 12/2013 | Ahn | C23C 16/18 438/785 |
| 2014/0024212 A1 | 1/2014 | Ryan et al. | |
| 2017/0077037 A1 | 3/2017 | Kelly et al. | |

(Continued)

FOREIGN PATENT DOCUMENTS

| | | | | |
|---|---|---|---|---|
| EP | 1120474 A1 | 1/2001 | | |
| EP | 1120474 A1 * | 8/2001 | ............. | C23C 16/34 |
| WO | 2016073707 A1 | 5/2016 | | |

OTHER PUBLICATIONS

PCT International Search Report and Written Opinion in PCT/US2021/026948 dated Aug. 6, 2021, 11 pages.

*Primary Examiner* — Jose I Hernandez-Kenney

(74) *Attorney, Agent, or Firm* — Servilla Whitney LLC

(57) ABSTRACT

Methods for selectively depositing on surfaces are disclosed. Some embodiments of the disclosure utilize an organometallic precursor that is substantially free of halogen and substantially free of oxygen. Deposition is performed to selectively deposit a metal film on a non-metallic surface over a metallic surface. Some embodiments of the disclosure relate to methods of gap filling.

11 Claims, 7 Drawing Sheets

(56) References Cited

U.S. PATENT DOCUMENTS

2018/0158686 A1*  6/2018  Gelatos ................ C23C 16/045
2019/0109009 A1*  4/2019  Longrie ................ H01L 21/321
2020/0105515 A1*  4/2020  Maes ................ H01L 21/76849

* cited by examiner

SELECTIVE DEPOSITION OF TITANIUM FILMS

TECHNICAL FIELD

Embodiments of the disclosure generally relate to methods of depositing a metal film. More particularly, embodiments of the disclosure are directed to methods of improving depositing a metal film using precursors that are oxygen-free and halide-free.

BACKGROUND

Integrated circuits are made possible by processes that produce intricately patterned material layers on substrate surfaces. Producing patterned material on a substrate requires controlled methods for deposition of desired materials. Selectively depositing a film on one surface relative to a different surface is useful for patterning and other applications.

In the manufacture of integrated circuits, contact level metallization schemes are often used to provide low resistance contacts to an underlying semiconductor material. Typically, contact level metallization schemes combine a barrier layer with a contact level metal layer.

High aspect ratio apertures including contacts, vias, lines, and other features used to form multilevel interconnects, which use cobalt, tungsten, or copper for example, continue to decrease in size as manufacturers strive to increase circuit density and quality. When a metal contact structure is fabricated, a barrier layer (e.g., titanium nitride (TiN) or vanadium nitride (VN)) is formed between the underlying semiconductor material (e.g., polysilicon) and the contact level metal layer (e.g., tungsten (W), aluminum (Al) or copper (Cu)). The barrier layer inhibits the diffusion of the tungsten, aluminum or copper into the underlying semiconductor material. Such tungsten, aluminum or copper diffusion is undesirable because it potentially changes the characteristics of the contact.

As circuit densities of integrated circuits increase, the widths of vias, lines and contacts may decrease to sub-micron dimensions (e.g., less than about 0.2 micrometers), whereas the thickness of the dielectric material layers between such structures typically remains relatively constant. This increases the aspect ratio for such features. Many traditional deposition processes (e.g., chemical vapor deposition (CVD) and physical vapor deposition (PVD)) are not useful for filling sub-micron structures where the aspect ratio exceeds 6:1, and especially where the aspect ratio exceeds 10:1.

A need exists, therefore, for a method of depositing metal films, e.g. titanium nitride (TiN) films, in high aspect ratio openings.

SUMMARY

One or more embodiments of the disclosure are directed to processing methods. The processing method comprises depositing a metal film on a first surface of a substrate selectively over a second surface that is a different material from the first surface of the substrate within a processing chamber during a deposition process, the deposition process comprising co-flowing an organometallic precursor and a reducing co-reactant precursor into the processing chamber, the organometallic precursor substantially free of halogen and substantially free of oxygen.

Additional embodiments of the disclosure are directed to methods of selective deposition. In one or more embodiments, a method of selective deposition, the method comprising: exposing a substrate comprising a metallic material having a first surface and a non-metallic material having a second surface to a blocking compound to selectively form a blocking layer on the first surface over the second surface; and sequentially exposing the substrate to an organometallic precursor and a reactant to form a film on the second surface over the blocking layer on the first surface, the organometallic precursor substantially free of halogen and substantially free of oxygen; and removing the blocking layer from the first surface.

Further embodiments of the disclosure are directed to methods of forming metal vias. In one or more embodiments, a method of forming metal vias comprises: providing a substrate having a substrate surface with at least one feature formed therein, the at least one feature having a sidewall and a bottom, the sidewall comprising a non-metallic material surface, the bottom comprising a metallic material surface; exposing the substrate to a blocking compound to selectively form a blocking layer on the metallic material surface over the non-metallic material surface; sequentially exposing the substrate to an organometallic precursor and a reactant to form a film on the non-metallic material surface over the blocking layer on the metallic material surface, the organometallic precursor substantially free of halogen and substantially free of oxygen; optionally removing the blocking layer from the metallic material surface; and depositing a conductive fill material within the at least one feature to form a low-resistance metal via.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1A:
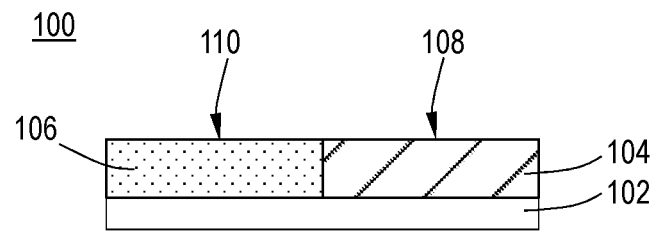
FIG. 1A illustrates partial cross-sectional view of a substrate in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "reactive gas", "precursor", "reactant", and the like, are used interchangeably to mean a gas that includes a species which is reactive with a substrate surface.

Chemical Vapor Deposition (CVD) processes, including plasma-enhanced chemical vapor deposition (PECVD), are different from Atomic Layer Deposition (ALD). An ALD process is a self-limiting process where a single layer of material is deposited using a binary (or higher order) reaction. The process continues until all available active sites on the substrate surface have been reacted. A CVD process is not self-limiting, and a film can be grown to any predetermined thickness. PECVD relies on use of energy in a plasma state to create more reactive radicals.

One or more embodiments provide organometallic precursors that do not have a halogen ligand and an oxygen moiety for use in reverse selective deposition processes. More specifically, one or more embodiments provide organometallic precursors that do not have a halogen and an oxygen moiety of use in the reverse deposition of titanium nitride (TiN) films. In one or more embodiments, strong Lewis acid of titanium species ($Ti^{4+}$) are paired with weak Lewis base of alkylamines with η3, η5, or η6 ligands. Embodiments of the present disclosure provide methods for selectively forming a barrier layer on a metallic material surface. Some embodiments of the present disclosure provide methods for selectively depositing a film on a non-metallic material surface over a metallic material surface.

As used herein, the term "halogen" refers to a binary phase, of which one part is a halogen atom and the other part is an element or radical that is less electronegative than the halogen, to make a fluoride, chloride, bromide, iodide, or astatide compound. A halide ion is a halogen atom bearing a negative charge. As known to those of skill in the art, a halide anion includes fluoride (F—), chloride (Cl—), bromide (Br—), iodide (I—), and astatide (At—). In one or more embodiments, the organometallic precursor is substantially free of a halogen and/or a halide. As used herein, the term "substantially free" means that there is less than 5%, including less than 4%, less than 3%, less than 2%, less than 1%, and less than 0.5% of halogen or halide present in the organometallic precursor.

In one or more embodiments, the organometallic precursor is substantially free of oxygen. As used herein, the term "substantially free" means that there is less than 5%, including less than 4%, less than 3%, less than 2%, less than 1%, and less than 0.5% of oxygen in the organometallic precursor.

Some embodiments of the disclosure advantageously provide for the selective deposition of metal films with high purity on metallic surfaces over dielectric surfaces. For example, selectively depositing metal (e.g., titanium) on copper over dielectrics advantageously provides copper capping layers without additional etch or lithography steps. Additionally, selective deposition may also enable bottom-up gapfill for features (e.g., trenches, vias) with metal contacts at the bottom and dielectric sidewalls.

Some embodiments of the disclosure advantageously provide for the selective deposition of metal films with high purity on dielectric surfaces over metallic surfaces. For example, selectively depositing metals over dielectrics advantageously provides metal layers on barriers or other dielectrics in back end applications.

As used herein, the phase "metallic material surface" or "non-metallic material surface" refers to the surface of a metallic or non-metallic material, respectively. In some embodiments, the non-metallic material is a dielectric material.

As used herein, the term "selectively depositing on a first surface over a second surface," and the like, means that a first amount or thickness is deposited on the first surface and a second amount or thickness is deposited on the second surface, where the second amount or thickness is less than the first amount or thickness, or, in some embodiments, no amount is deposited on the second surface.

As used herein, the term "over" does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

In some embodiments, the term "selectively" means that the subject material forms on the selected surface at a rate greater than or equal to about 2×, 3×, 4×, 5×, 7×, 10×, 15×, 20×, 25×, 30×, 35×, 40×, 45× or 50× the rate of formation on the non-selected surface. Stated differently, the selectivity of the stated process for the selected surface relative to the non-selected surface is greater than or equal to about 2:1, 3:1, 4:1, 5:1, 7:1, 10:1, 15:1, 20:1, 25:1, 30:1, 35:1, 40:1, 45:1 or 50:1.

The organometallic precursors of one or more embodiments are synthesized from alkylamine ligands with alkane hydrocarbons, such as, but not limited to, substituted cyclopentadiene derivatives. For example, in one or more embodiments, the organometallaic precursors have the structure of Formula (I):

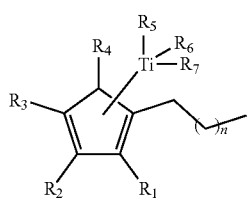

(I)

wherein $R_1$, $R_2$, $R_3$, and $R_4$ are independently selected from hydrogen (H) and alkyl; $R_5$, $R_6$, and $R_7$ independently comprise an alkylamine; and n is a number in a range of from 0 to 8.

Unless otherwise indicated, the term "lower alkyl," "alkyl," or "alk" as used herein alone or as part of another group includes both straight and branched chain hydrocarbons, containing 1 to 20 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents.

In one or more embodiments $R^1$, $R^2$, $R^3$, $R^4$ include but are not limited to hydrogen, methyl, ethyl, propyl, isopropyl, butyl, isobutyl, and tert butyl.

Unless otherwise indicated, the term "alkylamine" as used herein alone or as part of another group refers to an amine containing one or more alkyl groups.

In one or more embodiments, the alkylamine ligands can be selected from dimethylamine, diethylamine, dipropylamine, and diisopropylamine. In one or more embodiments, $R_5$, $R_6$, and $R_7$ independently comprise an alkylamine selected from —N(Me)$_2$, —N(Et)$_3$, —N(Propyl)$_2$, and N-(isopropyl)$_2$.

In one or more embodiments, as L$_2$X type ligands, saturated linear hydrocarbons, such as, but not limited to substituted cyclopentadienyl ligands, are employed for the design of oxygen-free and non-halide titanium molecular complexes.

In other embodiments, the organometallic precursors have a guanidinate complex structure selected from Formula (a), Formula (b), and Formula (c):

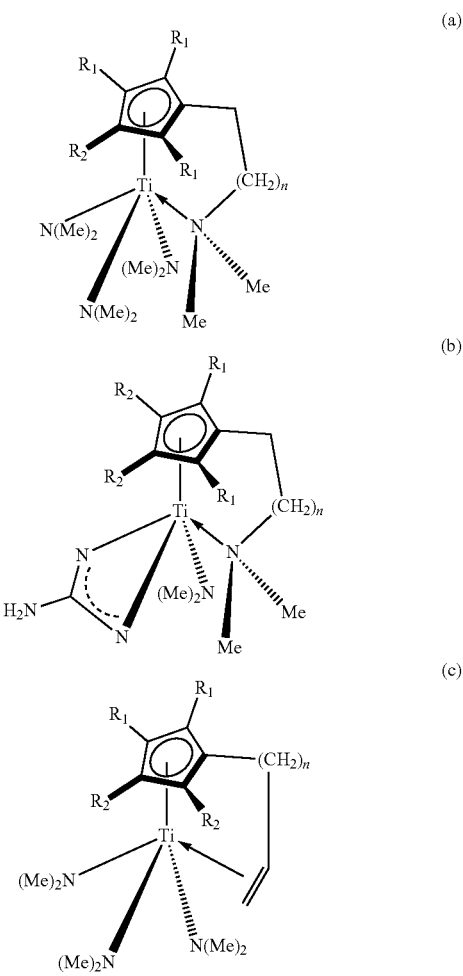

wherein $R_1$, $R_2$, $R_3$, and $R_4$ are independently selected from hydrogen (H) and alkyl; and n is a number in a range of from 0 to 8.

In one or more embodiments $R^1$, $R^2$, $R^3$, $R^4$ include but are not limited to hydrogen, methyl, ethyl, propyl, isopropyl, butyl, isobutyl, and tert butyl.

While in Formulae (a), (b), and (c) above, dimethylamine is depicted, one of skill in the art will recognize then any dialkyl amine may be used in place of dimethylamine. In one or more embodiments, the alkylamine ligands can be selected from dimethylamine, diethylamine, dipropylamine, and diisopropylamine. In one or more embodiments, $R_5$, $R_6$, and $R_7$ independently comprise an alkylamine selected from —$N(Me)_2$, —$N(Et)_3$, —$N(Propyl)_2$, and $N$-(isopropyl)$_2$.

In still further embodiments, the organometallic precursors may be selected from Formula (d), Formula (e), and Formula (f):

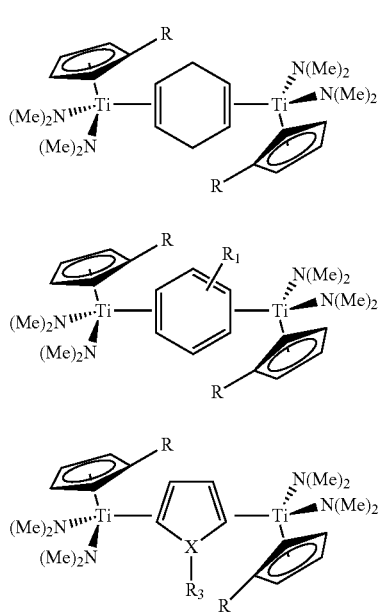

In Formula (d), Formula (e), and Formula (f), R is hydrrogen (H) or —$(CH_2)_n$, wherein n is from 0 to 8, $R_1$ and $R_3$ are hydrogen or alkyl, and X is carbon (C) or nitrogen (N). In one or more embodiments $R^1$ and $R^3$ include but are not limited to hydrogen, methyl, ethyl, propyl, isopropyl, butyl, isobutyl, and tert butyl.

In yet other embodiments, the organometallic precursors are selected from one or more of:

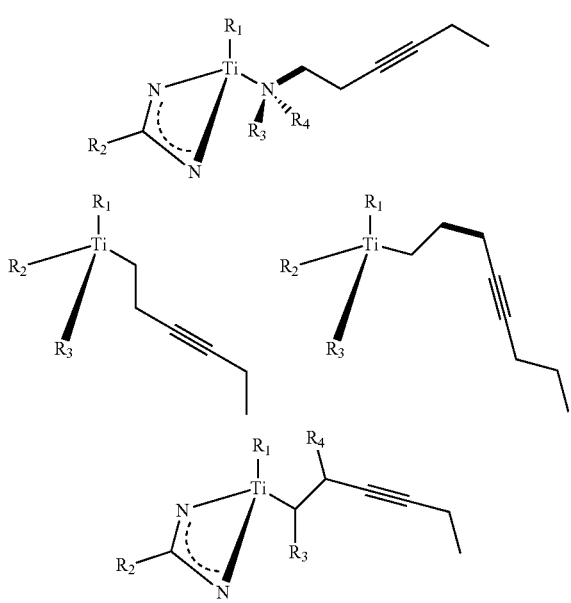

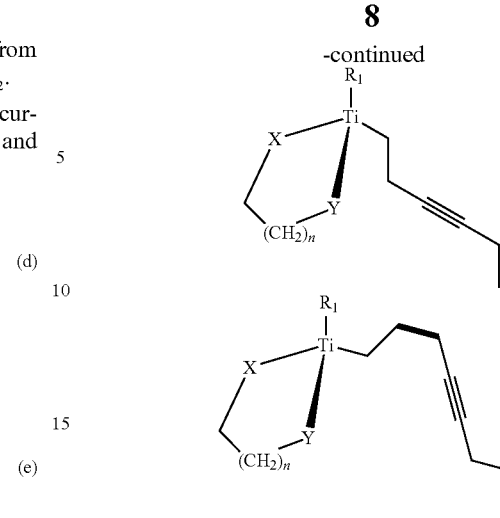

wherein $R_1$, $R_2$, $R_3$, and $R_4$ are independently selected from hydrogen (H) and alkyl. In one or more embodiments $R^1$, $R^2$, $R^3$, $R^4$ include but are not limited to hydrogen, methyl, ethyl, propyl, isopropyl, butyl, isobutyl, and tert butyl.

In one or more embodiments, X and Y are independently selected from carbon (C) or nitrogen (N), and n is a number in a range of from 0 to 8.

One or more embodiments provide methods of selectively forming a barrier layer on a first surface of a substrate over a second surface. The substrate comprises a metallic material with a first surface and a non-metallic material with a second surface. In some embodiments, the first surface may be described as a metallic material surface and the second surface may be described as a non-metallic material surface. In some embodiments, the barrier layer comprises a metal film. In one or more embodiments the barrier layer comprises titanium nitride (TiN).

The metallic material of the substrate may be any suitable metallic material. In some embodiments, the metallic materials of this disclosure are conductive materials. Suitable metallic materials include, but are not limited to, metals, metal nitrides, some metal oxides, metal alloys, silicon, combinations thereof and other conductive materials.

In some embodiments, the metallic material comprises chromium (Cr), manganese (Mn), iron (Fe), copper (Cu), nickel (Ni), cobalt (Co), tungsten (W), ruthenium (Ru), molybdenum (Mo), tantalum (Ta), titanium (Ti), vanadium (V), or combinations thereof. In some embodiments, the metallic material consists essentially of chromium (Cr), manganese (Mn), iron (Fe), copper (Cu), nickel (Ni), cobalt (Co), tungsten (W), ruthenium (Ru), molybdenum (Mo), tantalum nitride (TaN), titanium nitride (TiN), or vanadium nitride (VN). As used in this specification and the appended claims, the term "consists essentially of" means that the material is greater than or equal to about 95%, 98% or 99% of the stated material on an atomic basis.

The non-metallic material of the substrate may be any suitable material. In some embodiments, the non-metallic materials of this disclosure are dielectric materials. Suitable non-metallic materials include, but are not limited to, silicon oxides (e.g. $SiO_2$), silicon nitrides, silicon carbides and combinations thereof (e.g. SiCON). In some embodiments, the non-metallic material consists essentially of silicon dioxide ($SiO_2$). In some embodiments, the non-metallic material comprises silicon nitride. In some embodiments, the non-metallic material consists essentially of silicon nitride.

Embodiments of the disclosure provide processing methods to provide titanium layers in desired locations, including improved bottom coverage and selective deposition of titanium films in high aspect ratio features. As used in this specification and the appended claims, the terms "selective deposition of" and "selectively forming" a film on one surface over another surface, and the like, means that a first amount of the film is deposited on the first surface and a second amount of film is deposited on the second surface, where the second amount of film is less than the first amount of film or none. The term "over" used in this regard does not imply a physical orientation of one surface on top of another surface, rather a relationship of the thermodynamic or kinetic properties of the chemical reaction with one surface relative to the other surface. For example, selectively depositing a titanium film onto a silicon (Si) surface over a silicon dioxide ($SiO_2$) surface means that the titanium film deposits on the Si surface and less titanium film deposits on the $SiO_2$ surface; or that the formation of the titanium film on the Si surface is thermodynamically or kinetically favorable relative to the formation of a titanium film on the $SiO_2$ surface. Stated differently, the film can be selectively deposited onto a first surface relative to a second surface means that deposition on the first surface is favorable relative to the deposition on the second surface.

Embodiments of the disclosure are directed to methods of depositing a metal film on metallic surfaces preferentially over surfaces of a different material using plasma enhanced chemical vapor deposition (PECVD). The PECVD process of some embodiments comprises exposing the substrate surface to an organometallic precursor and a co-reactant. In one or more embodiments, the co-reactant can include a mixture of one or more species. In one or more embodiments, the co-reactant gas comprises one or more of argon (Ar), oxygen ($O_2$), hydrogen ($H_2$), nitrogen ($N_2$), hydrogen/nitrogen ($H_2/N_2$), and ammonia ($NH_3$).

The plasma gas can be any suitable gas that can be ignited to form a plasma and/or can act as a carrier or diluent for the organometallic precursor. In one or more embodiments, the plasma gas comprises ammonia ($NH_3$), and the ammonia is used a plasma treatment to activate one or more of the organometallic precursors.

In one or more embodiments, the plasma comprises one or more of nitrogen ($N_2$), argon (Ar), helium (He), hydrogen ($H_2$), carbon monoxide (CO), oxygen ($O_2$), ammonia ($NH_3$), or carbon dioxide ($CO_2$). In some embodiments, the plasma is a remote plasma.

In one or more embodiments, the plasma may be generated remotely or within the processing chamber.

In one or more embodiments, the deposition process is carried out in a process volume at pressures ranging from 0.1 mTorr to 10 Torr, including a pressure of about 0.1 mTorr, about 1 mTorr, about 10 mTorr, about 100 mTorr, about 500 mTorr, about 1 Torr, about 2 Torr, about 3 Torr, about 4 Torr, about 5 Torr, about 6 Torr, about 7 Torr, about 8 Torr, about 9 Torr, and about 10 Torr.

The precursor-containing gas mixture may further include one or more of a dilution gas selected from helium (He), argon (Ar), xenon (Xe), nitrogen ($N_2$), or hydrogen ($H_2$). The dilution gas of some embodiments comprises a compound that is inert gas relative to the reactants and substrate materials.

The plasma (e.g., capacitive-coupled plasma) may be formed from either top and bottom electrodes or side electrodes. The electrodes may be formed from a single powered electrode, dual powered electrodes, or more electrodes with multiple frequencies such as, but not limited to, 350 KHz, 2 MHz, 13.56 MHz, 27 MHz, 40 MHz, 60 MHz and 100 MHz, being used alternatively or simultaneously in a CVD system with any or all of the reactant gases listed herein to deposit a thin film of dielectric. In some embodiments, the plasma is a capacitively coupled plasma (CCP). In some embodiments, the plasma is an inductively coupled plasma (ICP). In some embodiments, the plasma is a microwave plasma.

In one or more embodiments, the plasma is an inductively coupled plasma (ICP) or a conductively coupled plasma (CCP). Any suitable power can be used depending on, for example, the reactants, or the other process conditions. In some embodiments, the plasma is generated with a plasma power in the range of about 10 W to about 10 kW.

Referring to FIGS. 1A to 1D, an exemplary method 100 begins with a substrate 102 comprising a metallic material 104 having a first surface 108 and a non-metallic material 106 having a second surface 110. In some embodiments, the substrate is exposed to a blocking compound (not illustrated) to selectively form a blocking layer 113 on the first surface 108 over the second surface 110. In some embodiments, the surface of the blocking layer 113 is described as a blocked first surface.

In some embodiments, the first surface 108 is cleaned prior to exposure to a blocking compound. The first surface may be cleaned by any suitable method including, but not limited to, a hydrogen thermal anneal, an ethanol clean, or a plasma hydrogen clean.

If a blocking compound is used, the blocking compound may be any suitable blocking compound known to one of skill in the art.

Figure 1B:
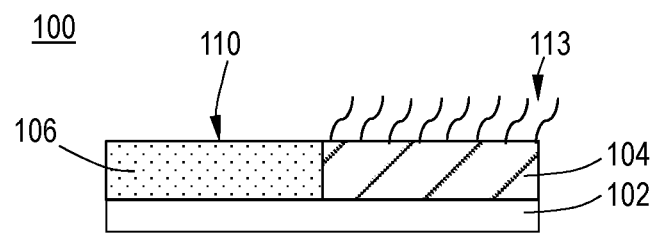
FIG. 1B illustrates partial cross-sectional view of a substrate in accordance with one or more embodiments of the disclosure.
Figure 1C:
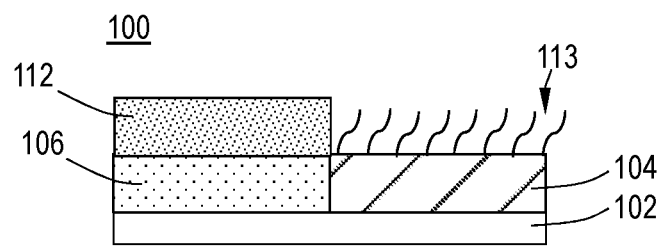
FIG. 1C illustrates partial cross-sectional view of a substrate in accordance with one or more embodiments of the disclosure.
Figure 1D:
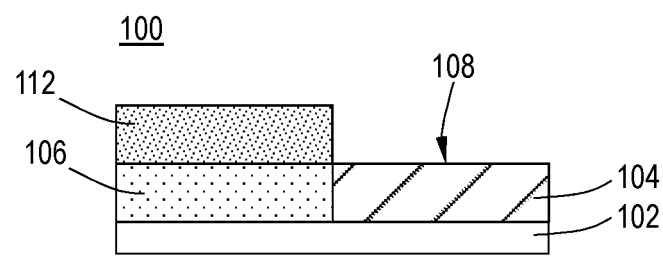
FIG. 1D illustrates partial cross-sectional view of a substrate in accordance with one or more embodiments of the disclosure.

In some embodiments, the method 100 continues with the deposition of a film 112 on the second surface 110 over the blocked first surface 113 (see FIG. 1B). The film 112 may be deposited by any known method.

In some embodiments, the film 112 is deposited by atomic layer deposition. "Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., metal precursor gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction).

In some embodiments, the film 112 is deposited by sequentially exposing the substrate 102 to the organometallic precursor of one or more embodiments and a reactant. In some embodiments, the film 112 comprises a metal nitride. In some embodiments, the film 112 comprises a metal oxide. In some embodiments, the film 112 comprises one or more of silicon (Si), aluminum (Al), titanium (Ti), tantalum (Ta), vanadium (V), hafnium (Hf), and zirconium (Zr).

In some embodiments, the film 112 functions as a barrier film, barrier layer, or diffusion layer. In some embodiments, the film 112 comprises titanium nitride. In some embodiments, the film 112 comprises vanadium nitride. In some embodiments, the film 112 comprises tantalum nitride. In some embodiments, the film 112 comprises aluminum oxide. In some embodiments, the film is formed without the use of plasma.

In some embodiments, the film 112 is deposited at a temperature which does not impact the stability of the blocking layer 113. In some embodiments, the film 112 is deposited at a temperature in a range of about 100° C. to about 380° C. or in a range of about 100° C. to about 400° C.

In some embodiments, the substrate is exposed to the blocking compound between ALD cycles. In some embodiments, the substrate may be re-exposed to the blocking compound after each deposition cycle. In some embodiments, the substrate may be re-exposed to the blocking compound after several deposition cycles.

In some embodiments, the method continues by removing the blocking layer 113 from the first surface 108. The blocking layer may be removed by any suitable means, including but not limited to, plasma cleaning processes or thermal decomposition.

In some embodiments, the substrate is exposed to a plasma to remove the blocking layer 113 from the first surface 108. In some embodiments, the plasma comprises argon (Ar), nitrogen ($N_2$) or hydrogen ($H_2$). In some embodiments, the plasma consists essentially of argon. In some embodiments, the plasma comprises a mixture of $H_2$/Ar. In some embodiments, the mixture of $H_2$/Ar is about 1:1.

The power of the plasma may be varied depending on the composition and thickness of the blocking layer and the surrounding materials. In some embodiments, the plasma power is in a range of about 50 W to about 500 W, in a range of about 100 W to about 450 W, or in a range of about 200 W to about 400 W. In some embodiments, the plasma power is about 50 W, about 200 W or about 400 W.

The duration of the plasma exposure may be varied depending on the composition and thickness of the blocking layer and the surrounding materials. In some embodiments, the substrate is exposed to the plasma for a period in a range of about 2 s to about 60 s, in a range of about 3 s to about 30 s, or in a range of about 5 s to about 10 s. In some embodiments, the substrate is exposed to the plasma for a period of about 3 s, about 5 s, about 10 s or about 30 s.

In some embodiments, the substrate is exposed to an elevated temperature to remove the blocking layer 113 from the first surface 108. In some embodiments, the elevated temperature is greater than or equal to about 300° C., greater than or equal to about 320° C., greater than or equal to about 325° C., greater than or equal to about 330° C., greater than or equal to about 350° C., greater than or equal to about 380° C., or greater than or equal to about 400° C.

For the purposes of FIGS. 1A to 1D, the metal film 112 comprises titanium, the metallic material 104 having a first surface comprises silicon (Si), and the non-metallic material 106 having a second surface 110 comprises SiOx or SiN. The present disclosure is directed to metal films that may comprise, but are not limited to, titanium, vanadium, zirconium, and/or hafnium. In specific embodiments, the metal film comprises titanium. These metal films may optionally be doped by a dopant including but not limited to phosphorus (P), arsenic (As), and/or boron (B). Metallic surfaces may comprise, but are not limited to, Si, Ge, and/or SiGe. Surfaces of a different material may comprise, but are not limited to silicon oxide ($SiO_x$), silicon nitride (SiN), silicon oxide-nitride (SiON), each of which optionally being carbon-doped.

Figure 2A:
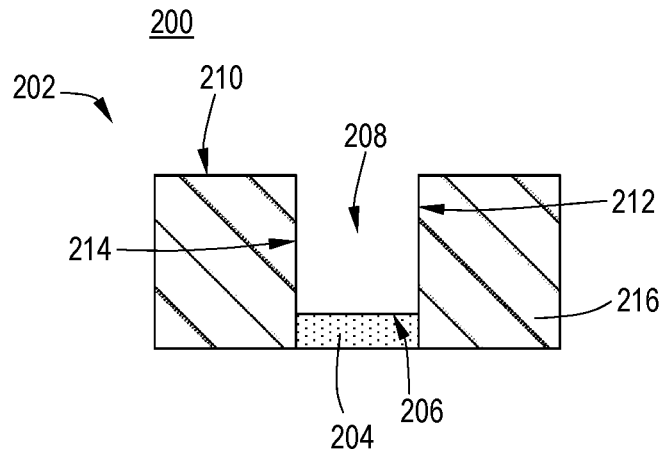
FIG. 2A illustrates partial cross-sectional view of a substrate in accordance with one or more embodiments of the disclosure.
Figure 2B:
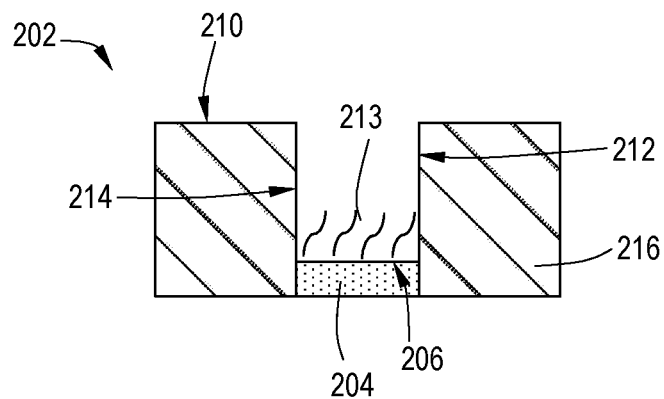
FIG. 2B illustrates partial cross-sectional view of a substrate in accordance with one or more embodiments of the disclosure.
Figure 2C:
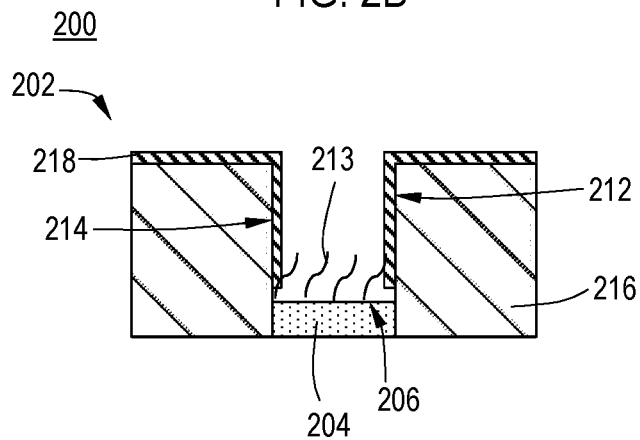
FIG. 2C illustrates partial cross-sectional view of a substrate in accordance with one or more embodiments of the disclosure.

Referring to FIGS. 2A-2C, an exemplary method 200 begins by providing a substrate 202 having a substrate surface 210 with at least one feature 208 formed therein. The at least one feature 208 has sidewalls 212, 214 and a bottom 206. The sidewalls 212, 214 comprise a non-metallic material 216 surface. The bottom 206 comprises a metallic material 204 surface.

Referring to FIG. 2B, the method 200 continues by exposing the substrate 202 to a blocking compound (not shown) to selectively form a blocking layer 213 on the metallic material 204 surface on the bottom 206 of the feature 208 over the non-metallic material 216 surface on the sidewalls 212, 214. In one or more embodiments, the hydrocarbon chain of the organometallic precursor serves as a blocking compound for reverse selective deposition of the metal film on the non-metallic surface 216 over the metallic material 204.

With reference to FIG. 2C, the method 200 continues by depositing a metal film 218 on the non-metallic material 216 surface on the sidewalls 212, 214 of the feature 208 over the blocking layer 213. In some embodiments, the metal film 218 is deposited by sequentially exposing the substrate 202 to the organometallic precursor of one or more embodiments and a reactant.

Figure 2D:
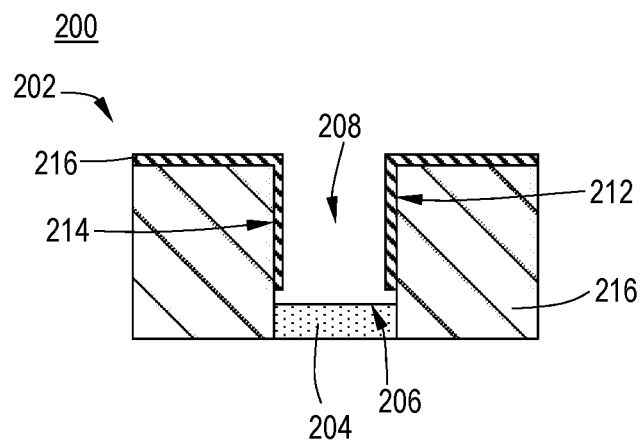
FIG. 2D illustrates partial cross-sectional view of a substrate in accordance with one or more embodiments of the disclosure.

Referring to FIG. 2D, the method 200 includes optionally removing the blocking layer 213 from the metallic material 204 surface on the bottom 206 of the feature 208. FIG. 2D shows the substrate 202 after the blocking layer 213 is removed according to some embodiments.

Without being bound by theory, it is believed that the blocking layer increases the resistance of the metal via only marginally when compared to the increase in resistance typically seen with most barrier layers (e.g. film 218). Accordingly, the removal of the blocking layer is an optional process which may further decrease the resistance of the metal via.

Figure 2E:
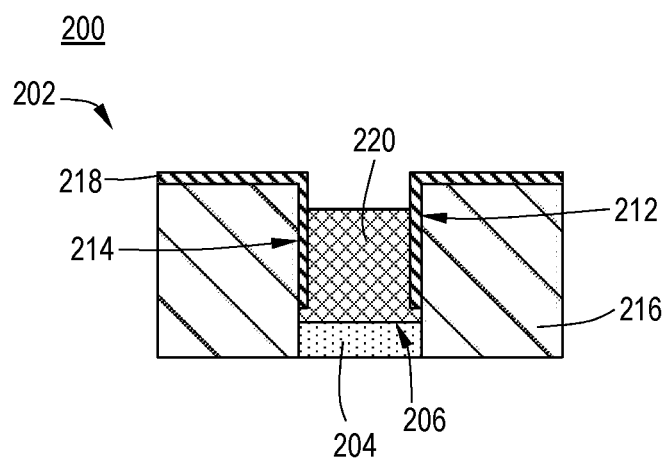
FIG. 2E illustrates partial cross-sectional view of a substrate in accordance with one or more embodiments of the disclosure.

Referring to FIG. 2E, the method 200 continues by depositing a conductive fill material 220 within the at least one feature 208 to form a low-resistance metal via. In some embodiments, the low-resistance metal via has a resistance less than or equal to about 80% of a metal via formed without the blocking layer. Stated differently, the low-resistance metal vias formed by the disclosed process including the blocking layer 213 provide a via resistance reduction of greater than or equal to about 20%.

Figure 3A:
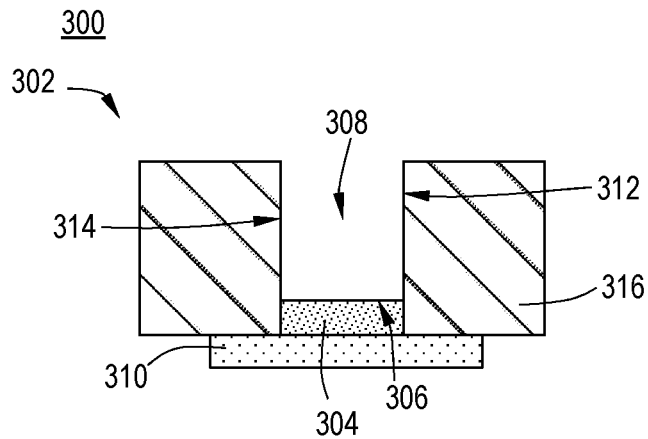
FIG. 3A illustrates a partial cross-section view of a substrate in accordance with one or more embodiments of the disclosure.
Figure 3B:
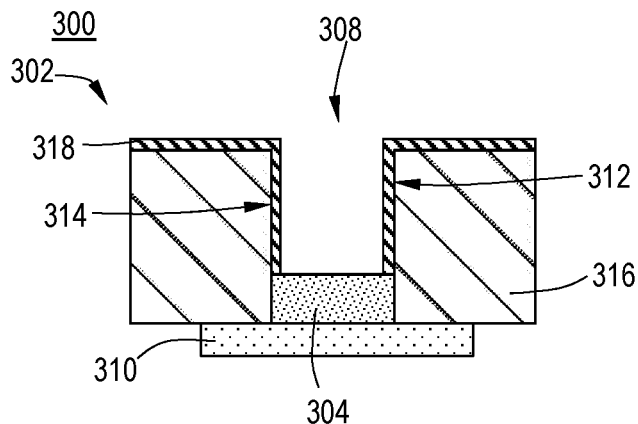
FIG. 3B illustrates a partial cross-section view of a substrate in accordance with one or more embodiments of the disclosure.
Figure 3C:
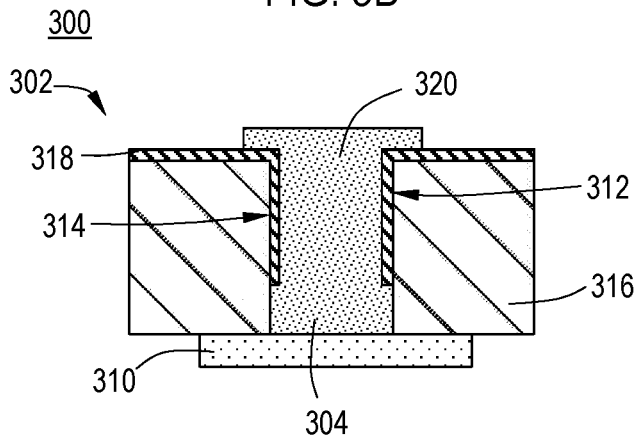
FIG. 3C illustrates a partial cross-section view of a substrate in accordance with one or more embodiments of the disclosure.

Referring to FIGS. 3A-3C, which are cross-sectional views of a substrate according to one or more embodiments, an exemplary method 300 begins with a substrate 302 having a first metal 210 with a non-metallic material 316, and a second metal 304 formed thereon. In one or more embodiments, at least one feature 308 formed therein. The at least one feature 308 has sidewalls 312, 314 and a bottom 306. The sidewalls 312, 314 comprise a non-metallic material 316 surface. The bottom 306 comprises a metallic material 304 surface.

Referring to FIG. 3B, the method 300 continues by exposing the substrate 302 to an organometallic precursor of one or more embodiments to selectively form or selectively deposit a metal film 318 on the non-metallic material 316 surface on the sidewalls 312, 314 of the feature 308 over the second metal layer 304. In some embodiments, the metal film 318 is deposited by sequentially exposing the substrate 302 to the organometallic precursor of one or more embodiments and a reactant.

Referring to FIG. 3C, the method 300 continues by depositing a gap fill material 320 within the at least one feature 308.

Figure 4:
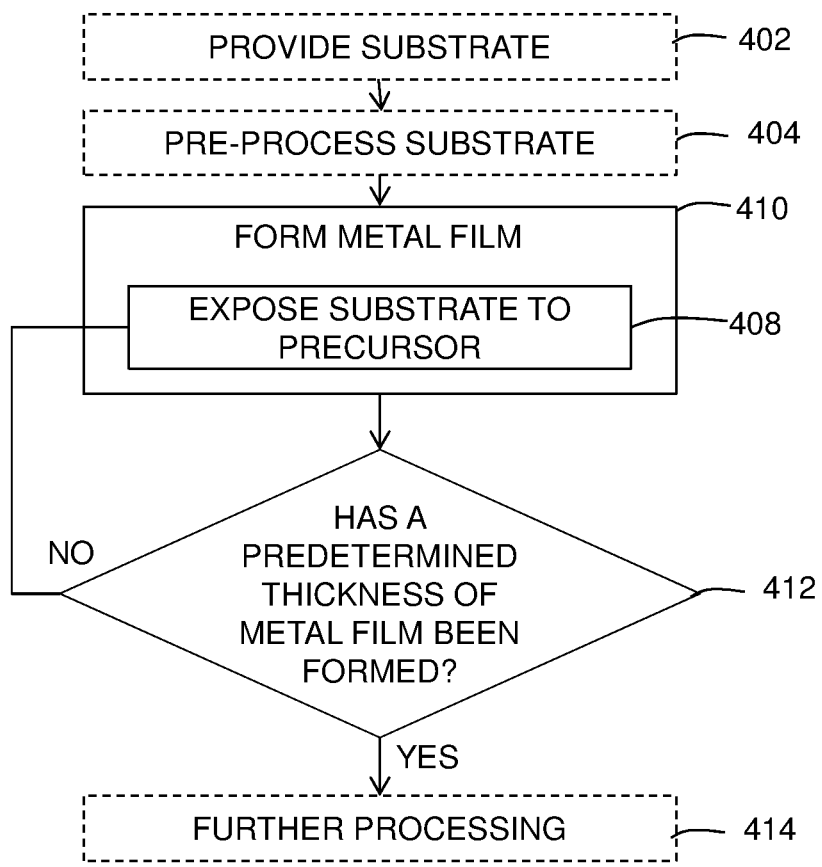
FIG. 4 depicts a process flow diagram according to one or more embodiments of the disclosure.

FIG. 4 depicts a process flow diagram according to one or more embodiments of the disclosure. Referring to FIG. 4, a generalized method 400 for forming a metal film on a substrate generally begins at operation 402, where a substrate upon which a metal film is to be formed may be provided and placed into a processing chamber. The substrate may optionally be pre-processed at operation 404. At operation 410, a metal film is formed by exposing the substrate to an organometallic precursor according to one or more embodiments. In some embodiments, a blocking compound is used such that the metal film is reverse selectively deposited on a dielectric surface over a metallic surfaces. In some embodiments, the hydrocarbon of alkyl ligands of the organometallic of one or more embodiments is designed for the metallic surface blocking during the reverse selective metal deposition. At operation 412, it is determined whether the metal film has achieved a predetermined thickness. If the predetermined thickness has not been achieved, the method 400 returns to operation 410 to continue forming the metal film until the predetermined thickness is reached. Once the predetermined thickness has been reached, the method 400 can either end or proceed to operation 414 for optional further processing (e.g., bulk deposition of another metal film). In one or more embodiments, the metal film may be deposited to form a total layer thickness of about 10 Å to about 10,000 Å, or in one or more embodiments, about 10 Å to about 1000 Å, or in one or more embodiments, about 50 Å to about 5,000 Å. In one or more embodiments, the metal film comprises titanium nitride (TiN).

Figure 5:
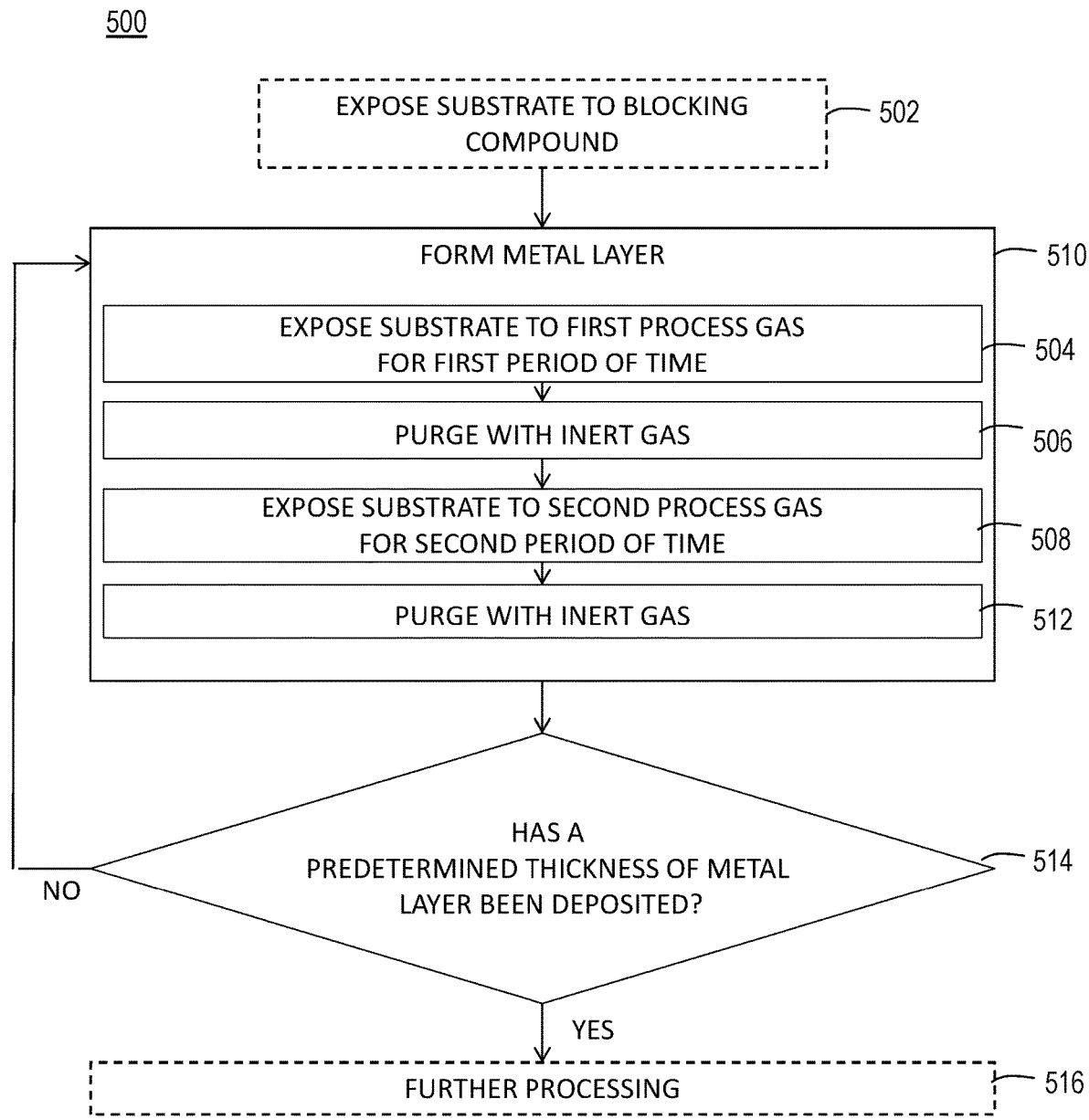
FIG. 5 depicts a process flow diagram according to one or more embodiments of the disclosure.
Figure 6:
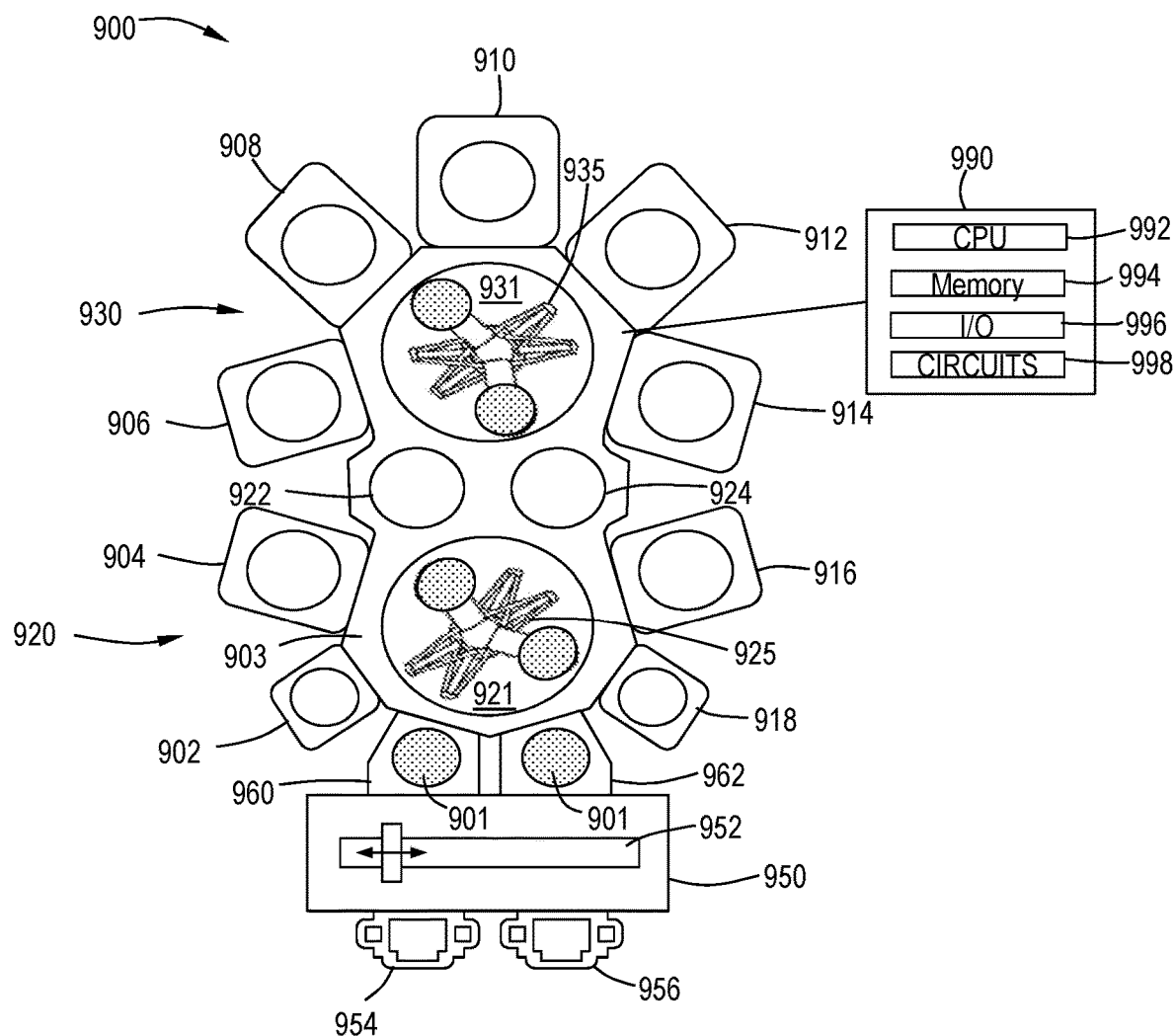
FIG. 6 illustrates a schematic view of a processing platform in accordance with one or more embodiments of the disclosure.

FIG. 5 illustrates a process flow diagram depicting a generalized method for forming a metal film on a substrate in accordance with one or more embodiments of the disclosure. The method 500 generally begins at operation 502, where a substrate upon which a metal film is to be formed may be placed into a processing chamber. In one or more embodiments, at operation 504, the substrate is optionally exposed to a blocking compound. The blocking compound may be useful for controlling the selectivity of the deposition process on a substrate comprising both a metal surface and a dielectric surface.

In one or more embodiments, at operation 510, a metal film is formed on the substrate. In one or more embodiments, the metal film may be formed via a cyclical deposition process, such as atomic layer deposition (ALD), or the like. In one or more embodiments, the process of forming the metal film at operation 510 may begin at operation 504 by exposing the substrate to a first process gas (or a first reactive gas) for a first period of time. In one or more embodiments, the first process gas comprises an organometallic precursor as described above.

The period of time that the substrate is exposed to the organometallic precursor containing gas may be any suitable amount of time necessary to allow the organometallic precursor to form an adequate adsorption layer atop the substrate surface(s). For example, the process gas may be flowed into the process chamber for a period of about 0.1 seconds to about 90 seconds. In some time-domain ALD processes, organometallic precursor containing gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In one or more embodiments, an inert gas may additionally be provided to the process chamber at the same time as the organometallic precursor containing gas. The inert gas may be mixed with the organometallic precursor containing gas (e.g., as a diluent gas) or be provided separately and can be pulsed or of a constant flow. In one or more embodiments, the inert gas is flowed into the processing chamber at a constant flow in the range of about 1 to about 10000 sccm. The inert gas may be any inert gas, for example, such as argon (Ar), helium (He), neon (Ne), or combinations thereof.

The temperature of the substrate during deposition can be controlled, for example, by setting the temperature of the substrate support or susceptor. In one or more embodiments, the substrate is held at a temperature in the range of about 0° C. to about 600° C., or in the range of about 25° C. to about 500° C., or in the range of about 50° C. to about 450° C., or in the range of about 100° C. to about 400° C., or in the range of about 200° C. to about 400° C., or in the range of about 250° C. to about 350° C. In one or more embodiments, the substrate is maintained at a temperature below the decomposition temperature of the metal precursor. In one or more embodiments, the substrate is maintained at a temperature below the decomposition temperature of the organometallic precursor. In one or more embodiments, the substrate is maintained at a temperature between the decomposition temperature of the organometallic precursor.

In addition to the foregoing, additional process parameters may be regulated while exposing the substrate to the organometallic precursor containing gas. For example, in one or more embodiments, the process chamber may be maintained at a pressure of about 0.2 to about 100 Torr, or in the range of about 0.3 to about 90 Torr, or in the range of about 0.5 to about 80 Torr, or in the range of about 1 to about 50 Torr.

Next, at operation 506, the process chamber (especially in time-domain ALD) may be purged using an inert gas. (This may not be needed in spatial ALD processes as there are gas curtains separating the reactive gases.) The inert gas may be any inert gas, for example, such as argon, helium, neon, or the like. In one or more embodiments, the inert gas may be the same, or alternatively, may be different from the inert gas provided to the process chamber during the exposure of the substrate to the organometallic precursor containing gas at operation 510. In embodiments where the inert gas is the same, the purge may be performed by diverting the first process gas from the process chamber, allowing the inert gas to flow through the process chamber, purging the process chamber of any excess first process gas components or reaction byproducts. In one or more embodiments, the inert gas may be provided at the same flow rate used in conjunction with the first process gas, described above, or in one or more embodiments, the flow rate may be increased or decreased. For example, in one or more embodiments, the inert gas may be provided to the process chamber at a flow rate of about 0 to about 10000 sccm to purge the process chamber. In spatial ALD, purge gas curtains are maintained between the flows of reactive gases and purging the process chamber may not be necessary. In one or more embodiments of a spatial ALD process, the process chamber or region of the process chamber may be purged with an inert gas.

The flow of inert gas may facilitated removing any excess first process gas components and/or excess reaction byproducts from the process chamber to prevent unwanted gas phase reactions of the first and second process gases.

Next, at operation 508, the substrate is exposed to a second process gas for a second period of time. The second process gas comprises a precursor which reacts with the adsorbed layer of organometallic precursor on the substrate surface to deposit a metal film.

In one or more embodiments, at operation 512, the process chamber may be purged using an inert gas. The inert gas may be any inert gas, for example, such as argon (Ar), helium (He), neon (Ne), or the like. In one or more embodiments, the inert gas may be the same, or alternatively, may be different from the inert gas provided to the process chamber during previous process routines. In embodiments where the inert gas is the same, the purge may be performed by diverting the second process gas from the process chamber, allowing the inert gas to flow through the process chamber, purging the process chamber of any excess second process gas components or reaction byproducts. In one or more embodiments, the inert gas may be provided at the same flow rate used in conjunction with the second process gas, described above, or in one or more embodiments, the flow rate may be increased or decreased. For example, in one or more embodiments, the inert gas may be provided to the process chamber at a flow rate of greater than 0 to about 10,000 sccm to purge the process chamber.

While the generic embodiments of the processing method shown in FIG. 5 includes only two pulses of reactive gases, it will be understood that this is merely exemplary and that additional pulses of reactive gases may be used. In one or more embodiments, the method is performed without the use of an oxygen-containing reactive gas. The sub processes of operation 510 comprise a cycle. A cycle may be performed in any order as long as the reactive gases are separated by a purge of the processing chamber. In one or more embodiments, the metal film is deposited at rate greater than or equal to about 0.2 Å/cycle, greater than or equal to about 0.3 Å/cycle, greater than or equal to about 0.4 Å/cycle, greater than or equal to about 0.5 Å/cycle, greater than or equal to about 0.6 Å/cycle, greater than or equal to about 0.7 Å/cycle, greater than or equal to about 0.8 Å/cycle, greater than or equal to about 0.9 Å/cycle, greater than or equal to about 1.0 Å/cycle, or greater than or equal to about 1.2 Å/cycle.

In one or more embodiments, the deposition process is performed as a thermal process without the use of plasma reactants. Stated differently, in one or more embodiments, the method is performed without plasma.

In one or more embodiments, at decision point 514, it is determined whether the metal film has achieved a predetermined thickness. If the predetermined thickness has not been achieved, the method 500 returns to operation 510 to continue forming the metal film until the predetermined thickness is reached. Once the predetermined thickness has been reached, the method 500 can either end or proceed to operation 516 for optional further processing (e.g., bulk deposition of another metal film). In one or more embodiments, the metal film may be deposited to form a total layer thickness of about 10 Å to about 10,000 Å, or in one or more embodiments, about 10 Å to about 1000 Å, or in one or more embodiments, about 50 Å to about 5,000 Å.

In some embodiments, the substrate is moved from a first chamber to a separate, next chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Additional embodiments of the disclosure are directed to processing tools 900 for the formation of the devices and practice of the methods described, as shown in FIG. 5. The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a physical vapor deposition chamber, a UV curing chamber, an ICP chamber, an etching chamber, and the like. The particular arrangement of process chambers and components can be varied depending on the cluster tool and should not be taken as limiting the scope of the disclosure.

In the embodiment shown in FIG. 5, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit (CPU) 992, memory 994, inputs/outputs (I/O) 996, and support circuits 998. The controller 990 may control the processing tool 900 directly, or via computers (or controllers) associated with particular process chamber and/or support system components.

In one or more embodiments, the controller 990 may be one of any form of general-purpose computer processor that can be used in an industrial setting for controlling various chambers and sub-processors. The memory 994 or computer readable medium of the controller 990 may be one or more of readily available memory such as non-transitory memory (e.g. random access memory (RAM)), read only memory (ROM), floppy disk, hard disk, optical storage media (e.g., compact disc or digital video disc), flash drive, or any other form of digital storage, local or remote. The memory 994 can retain an instruction set that is operable by the processor (CPU 992) to control parameters and components of the processing tool 900.

The support circuits 998 are coupled to the CPU 992 for supporting the processor in a conventional manner. These circuits include cache, power supplies, clock circuits, input/output circuitry and subsystems, and the like. One or more processes may be stored in the memory 994 as software routine that, when executed or invoked by the processor, causes the processor to control the operation of the processing tool 900 or individual processing units in the manner described herein. The software routine may also be stored and/or executed by a second CPU (not shown) that is remotely located from the hardware being controlled by the CPU 992.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 990 has one or more configurations to execute individual processes or sub-processes to perform the method. The controller 990 can be connected to and configured to operate intermediate components to perform the functions of the methods. For example, the controller 990 can be connected to and configured to control a physical vapor deposition chamber.

Processes may generally be stored in the memory 994 of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the system controller 990 has a configuration to control a chemical vapor deposition chamber to deposit a film on a substrate at a temperature in the range of about 20° C. to about 400° C. and control a remote plasma source to form a metal film on the substrate.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a physical vapor deposition chamber and a remote plasma source; a UV curing chamber; an ICP chamber; and a controller connected to the central transfer station and the plurality of process stations, the controller configured to activate the robot to move the wafer between process stations, and to control a process occurring in each of the process stations.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
    selectively depositing a titanium film on a non-metallic material on a substrate selectively relative to a metallic material on the substrate during a deposition process, the deposition process comprises co-flowing an organometallic precursor and a co-reactant over the substrate, the organometallic precursor substantially free of halogen and substantially free of oxygen and the organometallic precursor comprising a structure selected from

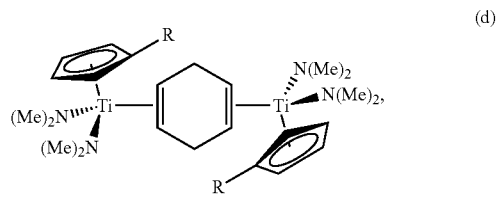

-continued

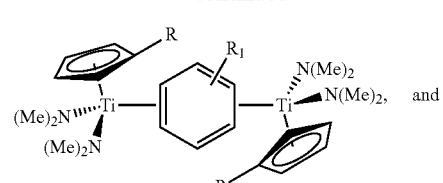 and

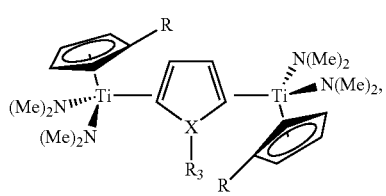

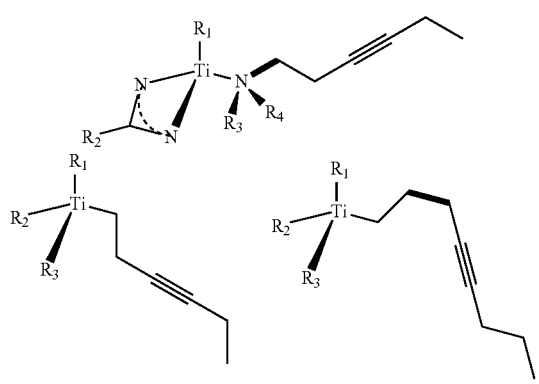

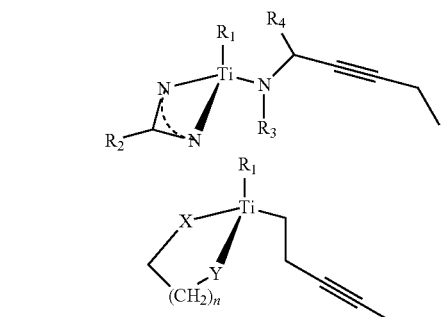

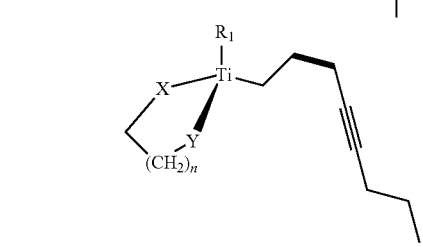

wherein R is hydrogen (H) or —(CH$_2$)$_n$, R$_1$, R$_2$, R$_3$, and R$_4$ are independently selected from hydrogen (H) and alkyl, R$_5$, R$_6$, and R$_7$ independently comprise an alkylamine, X and Y are independently selected from carbon (C) or nitrogen (N), and n is a number in a range of from 0 to 8.

2. The processing method of claim 1, wherein the metallic material comprises metallic silicon (Si), metallic germanium (Ge), or SiGe alloy, each of which optionally being doped with phosphorus (P), arsenic (As), and/or boron (B), and the non-metallic material comprises silicon oxide (SiO$_x$), silicon nitride (SiN), or silicon oxide-nitride (SiON), each of which optionally being carbon-doped.

3. The processing method of claim 1, wherein the titanium film is selectively deposited with a selectivity of at least about 1.3:1 on the non-metallic material relative to the metallic material.

4. The processing method of claim 1, wherein the deposition process is a PECVD process comprising a direct plasma at a plasma power in the range of about 1 to less than about 700 mWatts/cm$^2$ and a substrate temperature of ≤500° C.

5. The processing method of claim 4, wherein a plasma power is provided every about 0.00001 to about 100 seconds for a duration of about 0.0000001 to about 90 seconds.

6. The processing method of claim 4, wherein the PECVD process comprises a direct plasma at a frequency in the range of about 10 kHz to about 50 MHz.

7. The processing method of claim 1, wherein the titanium film is titanium nitride.

8. A method of selective deposition, the method comprising:

exposing a substrate comprising a metallic material having a first surface and a non-metallic material having a second surface to an organometallic precursor and a reactant to form a titanium film on the second surface relative to the first surface, the organometallic precursor substantially free of halogen and substantially free of oxygen and the organometallic precursor comprising a structure selected from

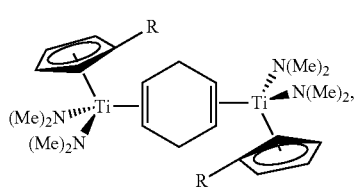

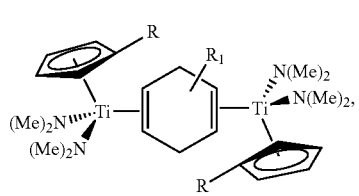

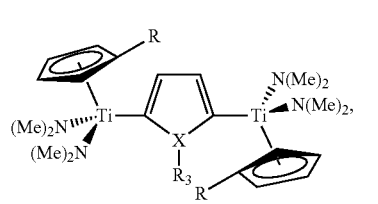

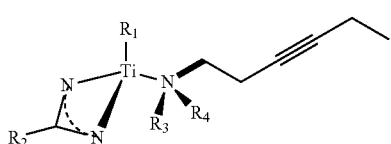

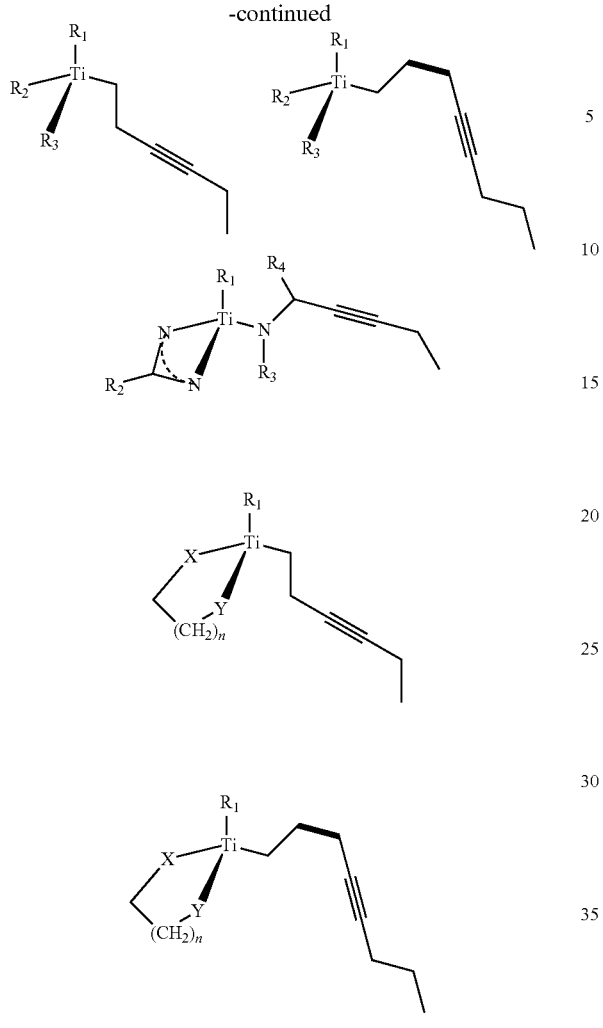

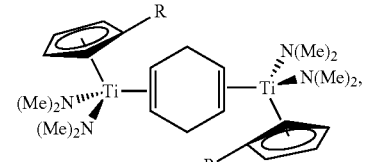

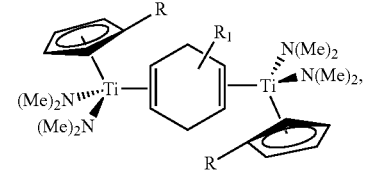

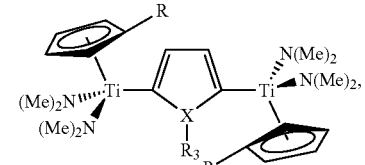

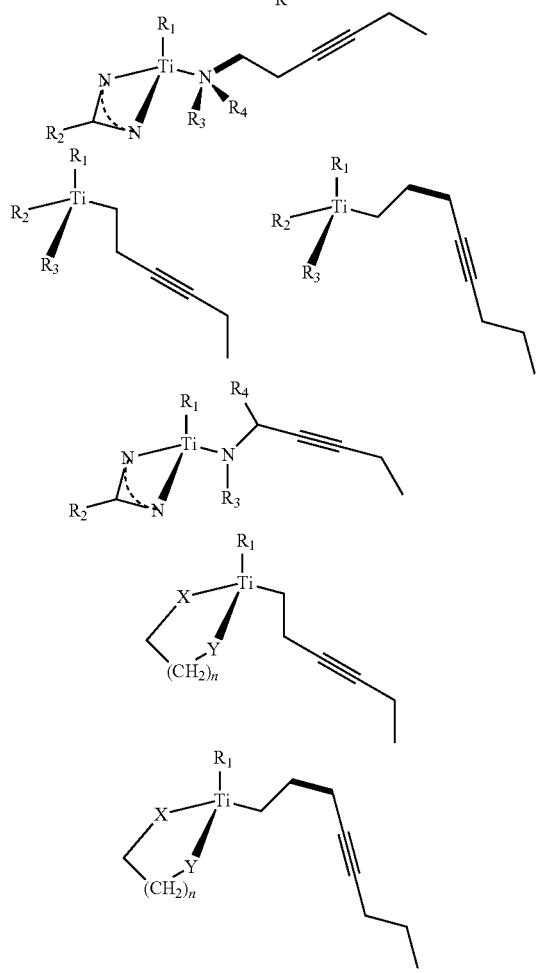

wherein R is hydrogen (H) or —$(CH_2)_n$, $R_1$, $R_2$, $R_3$, and $R_4$ are independently selected from hydrogen (H) and alkyl, $R_5$, $R_6$, and $R_7$ independently comprise an alkylamine, X and Y are independently selected from carbon (C) or nitrogen (N), and n is a number in a range of from 0 to 8.

9. The method of claim 8, wherein the titanium film is titanium nitride.

10. A method of forming metal vias, the method comprising:

exposing a substrate to a blocking compound to selectively form a blocking layer on a metallic material surface relative to a non-metallic material surface, the substrate comprising a substrate surface with at least one feature formed therein, the at least one feature having a sidewall and a bottom, the sidewall comprising the non-metallic material surface, the bottom comprising the metallic material surface;

sequentially exposing the substrate to an organometallic precursor and a reactant to form a barrier layer on the non-metallic material surface relative to the blocking layer on the metallic material surface, the organometallic precursor substantially free of halogen and substantially free of oxygen and the organometallic precursor comprising a structure selected from wherein R is hydrogen (H) or —$(CH_2)_n$, $R_1$, $R_2$, $R_3$, and $R_4$ are independently selected from hydrogen (H) and alkyl, $R_5$, $R_6$, and $R_7$ independently comprise an alkylamine, X and Y are independently selected from carbon (C) or nitrogen (N), and n is a number in a range of from 0 to 8;

optionally removing the blocking layer from the metallic material surface; and depositing a conductive fill material within the at least one feature to form a low-resistance metal via.

11. The method of claim 10, wherein the barrier layer comprises titanium nitride.

\* \* \* \* \*